(12) United States Patent
Newsome et al.

(10) Patent No.: US 7,560,049 B2
(45) Date of Patent: Jul. 14, 2009

(54) FORMING ELECTRONIC DEVICES

(75) Inventors: Christopher Newsome, Cambridgeshire (GB); Daping Chu, Cambridgeshire (GB)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/636,624

(22) Filed: Dec. 11, 2006

(65) Prior Publication Data

US 2007/0148797 A1    Jun. 28, 2007

(30) Foreign Application Priority Data

Dec. 14, 2005    (GB)    ................................. 0525449.5

(51) Int. Cl.
*H01L 51/40* (2006.01)
(52) U.S. Cl. .................... 252/500; 205/163; 106/31; 430/120.2; 430/122.4
(58) Field of Classification Search .................. 205/163; 252/500; 106/31.13; 430/120
See application file for complete search history.

(56) References Cited

U.S. PATENT DOCUMENTS

| 6,664,122 B1 * | 12/2003 | Andryuschenko et al. ..... 438/17 |
| 6,994,414 B2 * | 2/2006 | Hashimoto et al. ............ 347/19 |
| 2003/0083203 A1 * | 5/2003 | Hashimoto et al. .......... 505/100 |

FOREIGN PATENT DOCUMENTS

| WO | WO 02/43071 A1 | 5/2002 |
| WO | WO 03/075370 A2 | 9/2003 |
| WO | WO 2005/064705 A1 | 7/2005 |
| WO | WO 2005064705 A1 * | 7/2005 |

* cited by examiner

*Primary Examiner*—David Wu
*Assistant Examiner*—M. Reza Asdjodi
(74) *Attorney, Agent, or Firm*—Oliff & Berridge, PLC

(57) ABSTRACT

A method of manufacturing a device, comprising printing an aqueous solution or dispersion comprising an electronically functional substance, for example a conducting polymer such as PEDOT-PSS, and a surface tension reducing agent onto predetermined portions of a hydrophobic surface, for example formed by a ferroelectric polymer layer. The conducting polymer can form conductive tracks on either side of the ferroelectric layer to form a memory device.

12 Claims, 3 Drawing Sheets

FORMING ELECTRONIC DEVICES

FIELD OF THE INVENTION

The present invention relates to forming electronic devices by depositing a polymer in aqueous solution onto a hydrophobic surface. As an example, the present invention is particularly apposite for forming ferroelectric devices with organic polymer electrodes.

BACKGROUND OF THE INVENTION

Conducting polymers have been used in organic electronic devices for many years. They have played a role in forming conductive tracks and interconnections in organic thin film transistors, forming the source, drain and gate electrodes in these devices. In addition, they have also been implemented in organic light emitting diodes as a hole injection material in order to improve the charge carrier injection into the light-emissive material from a non-organic anode such as indium tin oxide (ITO).

Organic, particularly polymeric electronic devices are extremely attractive from a manufacturing aspect due to the possibility to fabricate devices in ambient conditions.

Functional electronic applications must comprise multiple devices. For example, a "smart card" may have a display, a display driver and a solar cell for producing power. In addition, a memory chip for data storage is also of importance to fabricate fully functional devices.

In inorganic devices, ceramic materials are utilised in order to achieve retention of data, thus allowing fabrication of memory chips. In the organic, or polymer field, ferroelectric polymers such as those based on poly(vinylidene fluoride) (PVDF) may be used to fabricate these devices. A particular example of a PVDF based polymer in which a memory effect has been demonstrated is poly(vinylidene fluoride-trifluoro-ethylene) (P(VDF/TrFE)). The testing of such materials for their applicability in a memory device can be performed by the fabrication of a cross point device. Cross point devices are based on the same principles as thin film capacitors.

An example of a cross point device is shown in FIG. 1a. Two electrodes 10, 11 are applied either side of a thin ferroelectric film 20, typically in the range of 200 nm to 2 microns in thickness, using metallic materials. Upon application of an electric field applied between the electrodes 10, 11, a polarisation response can be measured as a function of the electric field. A hysteretic nature in the polarisation vs. field plot will indicate the suitability of the material for a memory device.

An example of a ferroelectric memory is shown in FIG. 1b, in which a plurality of rows of electrodes 10a are provided under the ferroelectric film 20 and a plurality of columns of electrodes 10b are provided above the ferroelectric film. In a manner well-known in the art, the rows and columns of electrodes can be addressed to polarise the ferroelectric material at the intersection between an addressed row and an addressed column, thereby writing data. This data can subsequently be read by determining the polarisation of the ferroelectric material at the intersection between the addressed row and column.

More specifically, at each cross point, the top and bottom electrodes form a "bit" in a memory device, and can be read as a "1" or a "0" according to the spontaneous polarisation of the ferroelectric material. The spontaneous polarisation of a ferroelectric material is given by the value of the dipole moment per unit volume of material. In a ferroelectric material, the direction of the spontaneous polarisation can be switched by the electric field, and hence a polarisation hysteresis can be measured.

However, the hysteretic properties of the material are not the only requirements in order to be suitable for use in a ferroelectric polymer device. The compatibility of the polymer material in an existing fabrication framework of processes must also be addressed.

Fluorinated polymers such as that mentioned above may be used in ferroelectric capacitors, and are soluble in polar solvents such as 2-butanone. The high electronegativity of the fluorine atoms in the structure gives rise to this high polarity of the material, and therefore solubility in such a solvent. In addition to a high polarity, the fluorine content in these polymers also gives rise to a strong hydrophobic nature.

The contact angle of a water droplet on the surface of a thin film of this type of polymer is equal to or greater than 90 degrees. By exhibiting such a high contact angle, it is problematic to deposit or print a water based dispersion or solution of material on such a surface.

PEDOT:PSS is widely used as a conducting polymer in many organic devices, as explained above. PEDOT:PSS is widely and commercially available, for example in the form of Baytron-P solution, produced by H C Starck. The commercial Baytron-P solution is a water-borne solution of poly(ethylene dioxylthiophene) (PEDOT) in the presence of poly(styrene sulphonic acid) (PSS), which serves as a colloid stabiliser and dopant. Thus, the material is a dispersion of particles (in the nanometre scale) based in water and, consequently, when this material is deposited on the surface of a PVDF (or a co-polymer) film, the same de-wetting behaviour is exhibited.

This problem has been previously recognised and is addressed in WO 02/43071. Specifically, WO 02/43071 discloses a ferroelectric memory circuit comprising a ferroelectric memory cell in the form of a ferroelectric polymer thin film and first and second electrodes on either side. The electrodes are conducting polymer electrodes which are deposited on top of a ferroelectric thin film by spin coating from an H C Starck Baytron-P solution or dipping in such a solution. WO 02/43071 discloses that in the case of spin coating a certain amount of surfactant must be added to the Baytron-P solution to allow a uniform and smooth PEDOT/PSS film formation. However, neither the amount nor the nature of the surfactant to be added to the spin coating solution is disclosed in WO 02/43071.

WO 2005/064705 also discloses a ferroelectric device in which an aqueous PEDOT:PSS solution is deposited by spin coating on a ferroelectric polymer layer. To overcome the de-wetting properties of ferroelectric polymer layer, n-butanol is added in the aqueous solution as a surface-tension reducing agent with a concentration of 3% or lower, so that the solution remains in a single phase. In addition, a cross-linking agent may be provided in the aqueous solution.

Hitherto, and in both WO 02/43071 and WO 2005/064705, the PEDOT:PSS is deposited on the ferroelectric layer by spin coating or dipping so that it covers the whole surface of the ferroelectric layer. Subsequently, the PEDOT:PSS layer is patterned using known techniques, such as photolithography.

However, the use of such patterning techniques is undesirable as they require the highly accurate alignment of a mask over the layer to be patterned. Where it becomes necessary to pattern several layers, which is common in the formation of electronic devices or circuits, such as transistors and ferroelectric devices, difficulties with alignment are increased. Thus, the speed of manufacture is reduced and the cost of the devices is increased.

An attractive aspect of forming electronic devices using organic materials is the possibility of using flexible substrates, and reel-to-reel processing. However, the difficulties in the alignment required by patterning techniques are exacerbated and become prohibitive.

It is known to deposit conductive polymers on substrates using ink jet techniques, where the solution in which the conductive polymer is deposited has good wetting properties with respect to the substrate on which it is deposited. However, the de-wetting properties of fluorinated ferroelectric polymers with respect to aqueous solutions of conductive polymer have made it impossible to form a continuous conducting path of PEDOT:PSS by ink jet printing. The de-wetting nature in the drying process means that a "shrinking" type droplet is formed upon deposition. Such shrinking means that bridging of adjacent droplets with a high uniformity is not possible.

To illustrate, FIG. 2 shows the chemical structure of PEDOT:PSS. In a typical aqueous dispersion such as the commercially available Baytron-P solution suitable for ink jet printing on a hydrophilic surface, the solid content is in the region of 0.3 to 1% by volume, corresponding to around 6 to 15 cP in viscosity at room temperature. However, FIG. 2 shows the pattern that results when droplets 30 of such an aqueous solution are ink jet printed on a fluorinated polymer layer 20. Although the droplets are of the same size and are equidistantly spaced when deposited by ink jet printing so that a continuous track would be formed were there to be no de-wetting properties, in practice the droplets 30 shrink to different sizes and fail to form a continuous conducting path. More specifically, the nature of the de-wetting process means that during the shrinking of a droplet on the surface, a lateral movement of this droplet may occur, resulting in an irregular pattern being formed. In addition to this lateral movement, droplets may coalesce in order to minimise the surface area before drying. Thus, a dried printed line may contain differing sizes of droplets on the surface. This phenomenon also hinders the formation of continuous tracks of inks.

The suitability of the prior art aqueous solutions of PEDOT:PSS and surface tension-reducing agents for ink jet printing on hydrophobic surfaces has not been demonstrated. In particular, solutions that are suitable for spin coating are not adapted or suitable for use with ink jet heads. Consequently, the formation of conducting polymers on hydrophobic surfaces using ink jet printing techniques has not hitherto been considered as workable.

SUMMARY OF THE INVENTION

According to a first aspect of the present invention, there is provided a method of manufacturing a device, comprising:
printing an aqueous solution or dispersion comprising an electronically functional substance and a surface tension reducing agent onto predetermined portions of a hydrophobic surface.

Preferably, the electronically functional substance is a conducting polymer and more preferably it is PEDOT-PSS.

Preferably, the hydrophobic surface is an organic hydrophobic surface and more preferably it is formed by a ferroelectric polymer layer.

Preferably, the surface tension-reducing agent comprises at least one ethylene group and at least one alkyl group. Advantageously, the surface tension-reducing agent may be any one of the Triton surfactants. It may comprise one or more of Triton X-100 and Triton X-45. In these embodiments, it is preferred that the aqueous solution comprises between 0.025% and 0.33% of the surface tension-reducing agent.

Preferably, the solid content of the polymer in the aqueous solution is between 0.3% and 1% and preferably the viscosity of the aqueous solution is between 6 cP and 15 cP at room temperature.

Advantageously, the aqueous solution can be deposited by ink jet printing, although other forms of printing are also contemplated.

Advantageously, the device may be a ferroelectric memory device.

The printed aqueous solution may dry to deposit conductive tracks and/or electrodes over the predetermined portions of the hydrophobic surface.

In addition, the aqueous solution may be further printed over predetermined areas of a non-hydrophobic surface.

Preferably, the surface tension-reducing agent is a non-ionic surfactant.

According to another aspect of the present invention, there is provided an electronic device produced according to the above-described method.

According to another aspect of the present invention, there is provided an ink for depositing an electronically functional substance on a hydrophobic surface, the ink comprising a polymer in a solvent and a surface tension-reducing agent.

Preferably, the polymer is a conductive polymer and more preferably it is PEDOT-PSS. It is preferred that the content of PEDOT in the ink is between 0.16% and 0.5%. It is also preferred that the ink further comprises between 0.25% and 0.8% PSS.

Preferably, the surface tension-reducing agent comprises at least one ethylene group and at least one alkyl group. Advantageously, it may comprise any one of the Triton surfactants. It may comprise one or more of Triton X-100 and Triton X-45.

Preferably, the ink is an aqueous solution comprising between 0.025% and 0.33% of the surface tension-reducing agent.

Preferably, the solid content is between 0.3% and 1%. It is also preferred that the viscosity of the ink is between 6 cP and 15 cP at room temperature. In particular, it is preferred that the ink is suitable for ink jet printing.

Advantageously, the ink can dry to deposit conductive tracks and/or electrodes over predetermined portions of a hydrophobic surface.

Preferably, the surface tension-reducing agent is a non-ionic surfactant.

According to another aspect of the present invention, there is provided an electronic device produced using an ink as described above.

BRIEF DESCRIPTION OF THE DRAWINGS

The present invention will now be described by way of example only, with reference to the following drawings, in which.

DETAILED DESCRIPTION

According to the present invention, an additional component is added to an aqueous solution of a conductive polymer or other electronically functional substance, such as a conducting aqueous polymeric dispersion of PEDOT:PSS, and the resulting solution is printed on a hydrophobic substrate, preferably by ink jet deposition. It is preferred that the additional component is a non-ionic surfactant.

The present invention allows ink jet or other printing of continuous tracks on the strongly hydrophobic surfaces that are exhibited by the ferroelectric polymer PVDF and its co-polymers, such as P(VDF/TrFE).

At the same time, formulations used in the present invention have a sufficiently strong surface tension, so that the contact angle between the aqueous solution when deposited on the hydrophobic surface is large enough to prevent the solution from spreading too much before drying. This prevents the conducting tracks of polymer material from being undesirably broad and having insufficient conductivity.

Moreover, formulations used in the present invention have a viscosity suitable for use in ink jet deposition apparatuses or, where desired, other printing techniques.

Figure 1A:
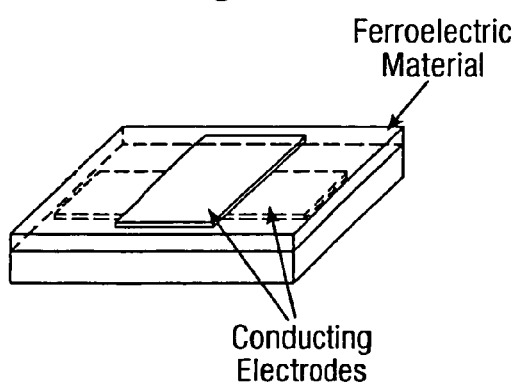
FIGS. 1a and 1b are schematic representations of ferroelectric cross point devices.
Figure 1B:
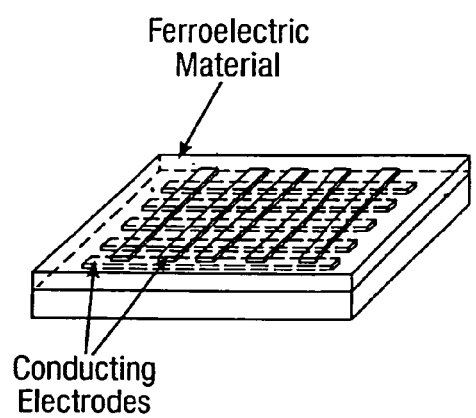
Figure 2:
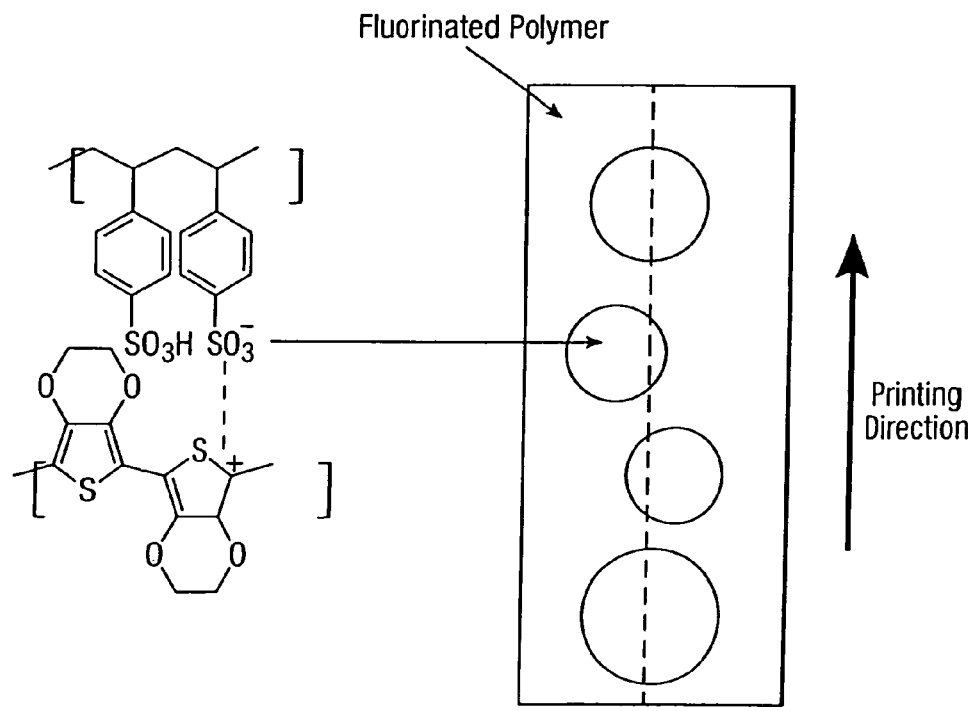
FIG. 2 is a schematic representation of a typical result from ink jet printing a track of a conducting polymer dispersion of PEDOT:PSS on a P(VDF/TrFE) surface.
Figure 3:
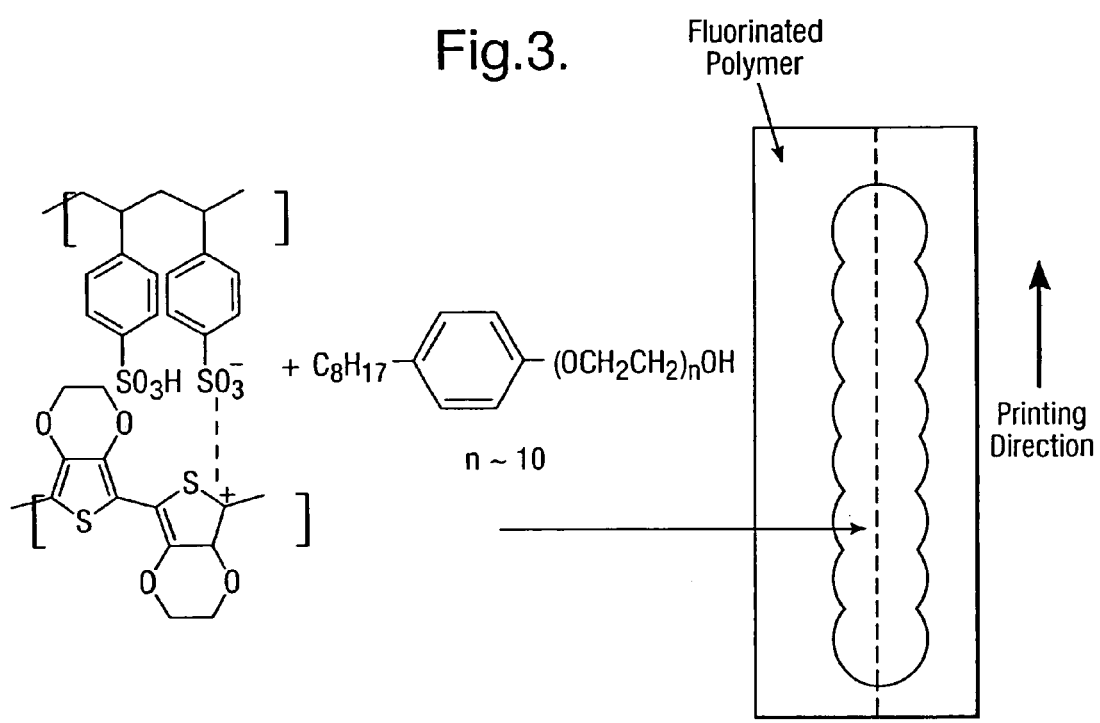
FIG. 3 is a schematic representation of a typical result from ink jet printing a track of a conducting polymer dispersion PEDOT:PSS on a P(VDF/TrFE) surface according to the present invention.

In a preferred embodiment, an aqueous solution is used for ink jet printing and is comprised of a commercially available solution of PEDOT:PSS, diluted with water and mixed with an aqueous dilution of solution of polyethylene glycoltert-octylphenyl ether (also known as Triton X-100). FIG. 3 shows the chemical structure of this surfactant, which is added to the PEDOT:PSS dispersion. Polyethylene glycoltert-octylphenyl ether (Triton X-100) is readily soluble in water.

By mixing Triton X-100 and the PEDOT:PSS dispersion, the contact angle of the resulting ink can be reduced to less than 30 degrees, and remains compatible with ink jet print heads at room temperature. The effect of using this material in such an ink is highlighted in FIG. 3. A continuous printed track can be fabricated with high repeatability without the lateral movement of droplets during the drying process. However, it is preferable to deposit only alternate droplets 25 on a first pass of the print head and the remaining droplets to fill the resulting gaps on a second pass of the print head.

Figure 4:
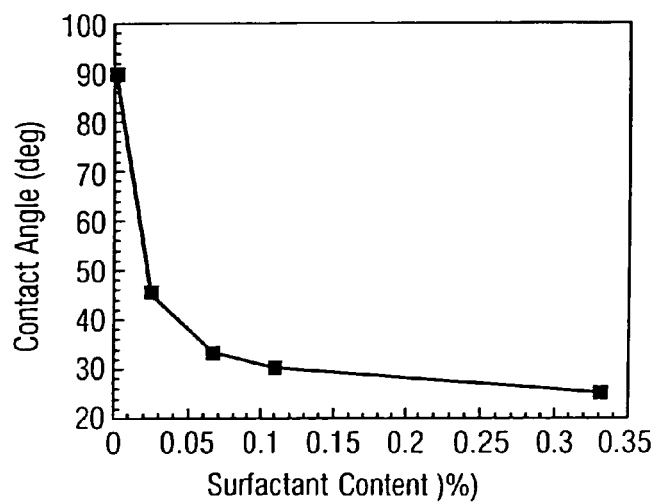
FIG. 4 illustrates the contact angle of the modified PEDOT:PSS dispersions used in the present invention as a function of the concentration of the Triton material ink component.

FIG. 4 shows the relation of the contact angle of a PEDOT:PSS: Triton ink droplet (as measured using a contact angle goniometer) as a function of the concentration of the Triton ink component. For ink jet printing, a contact angle of 30 degrees is preferable. It is worth noting, however, that for some cases a very low contact angle (less than 10 degrees) may not be suitable, as this increases the size of a dried droplet, and thus decreases the resolution of printed devices by ink jet printing. In the case of printing a cross-point array device for example, shorts may occur between adjacent lines if the separation between tracks is insufficiently large.

A preferred method of producing an aqueous solution of conducting polymer suitable for ink jet printing onto a fluorinated polymer film, as discussed above, is now described.

First, a commercially available PEDOT:PSS dispersion, such as the H C Starck Baytron-P solution is filtered through a 0.45 μm syringe filter.

Then, a diluted aqueous solution of the Triton material is prepared. As received in 100% concentration, the Triton material cannot be added directly to the PEDOT:PSS dispersion due to the strong effect of reducing the surface tension of the ink. In order to ensure an accurate control and tuning of the surface tension of the ink, a diluted Triton solution is prepared.

The function of adding an aqueous solution of the Triton material is not only to reduce the surface tension of the PEDOT:PSS ink, but to also reduce the viscosity of the PEDOT:PSS ink to a range which is more suitable for the ink jet head. The target value of the concentration of the original Baytron-P PEDOT:PSS dispersion, which has a solid content in the region of 1% by volume and a viscosity at room temperature in the region 15 cP, is one part Baytron-P solution to two parts of water.

The preparation of the diluted aqueous solution of the Triton material is typically performed by adding 1 ml of Triton material to 100 ml of deionised water. This diluted aqueous solution of the Triton material is then added in combination with deionised water to the host PEDOT:PSS dispersion.

Listed below are the four different preparations of inks resulting in the contact angle data shown in FIG. 4 alongside that of a Baytron-P solution diluted with deionised water only. Each of these inks was prepared using the above-described diluted aqueous solution of the Triton material and the commercial Baytron P solution, which contains 0.5% by weight PEDOT and 0.8% by weight PSS.

Ink 1: 1 ml PEDOT:PSS:1 ml Deionised water:1 ml diluted Triton solution.
  Resulting concentration of the diluted Triton solution in the ink of 33% by volume; thus concentration of the pure Triton material in the ink of 0.33% by volume
  Contact angle 25°

Ink 2: 1 ml PEDOT:PSS:1.66 ml Deionised water:0.33 ml diluted Triton solution.
  Resulting concentration of the diluted Triton solution in the ink of 11% by volume; thus concentration of the pure Triton material in the ink of 0.11% by volume
  Contact angle 30°

Ink 3: 1 ml PEDOT:PSS:1.8 ml Deionised water:0.2 ml diluted Triton solution.
  Resulting concentration of the diluted Triton solution in the ink of 6.66% by volume; thus concentration of the pure Triton material in the ink of 0.066% by volume
  Contact angle 33°

Ink 4: 1 ml PEDOT:PSS:1.95 ml Deionised water:0.05 ml diluted Triton solution.
  Resulting concentration of the diluted Triton solution in the ink of 2.5% by volume; thus concentration of the pure Triton material in the ink of 0.025% by volume
  Contact angle 45°

The prepared ink is then degassed in a vacuum prior to ink jet printing in order to ensure regular ejection from the ink jet nozzles.

The effect of reducing the surface tension in this manner is to enable printing of this ink onto a strongly hydrophobic surface. Such surfaces are encountered when using fluorinated polymers such as PVDF, and other co-polymers thereof.

These modifications of the ink allow the printing of an aqueous dispersion to make continuous tracks on a hydrophobic surface. This is of particular relevance for applications such as polymer memory cells, such as a cross-point array device. However, the invention is not limited to this application and can also be applied to other applications, such as the formation of transistors, resistors, capacitors, light emitting diodes and photovoltaic devices. It should be noted that the modified inks can also be printed over the edge of the hydrophobic film and onto the substrate on which the hydrophobic film is deposited. This is useful where it is required to connect rows and columns of conductive material to control circuitry provided outside the area of the hydrophobic film.

Figure 5:
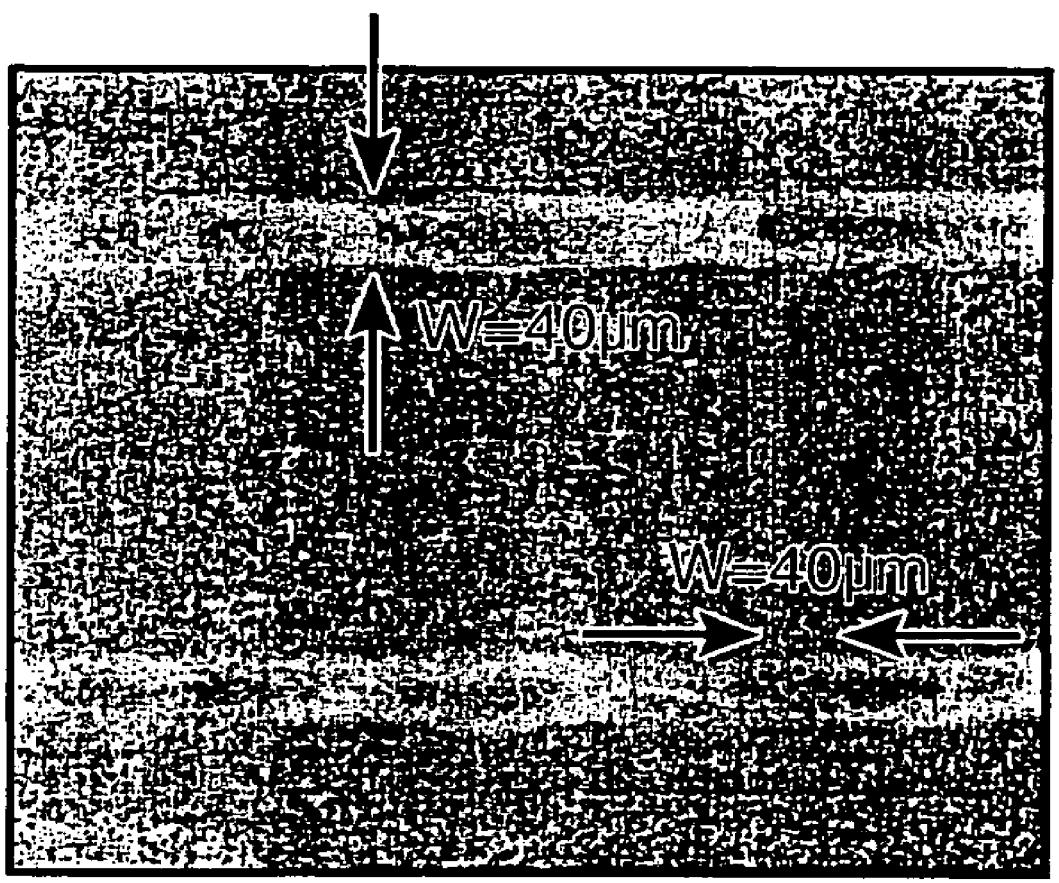
FIG. 5 is an image of a printed cross point array with a modified PEDOT:PSS dispersion and P(VDF/TrFE) as the ferroelectric material.

It is possible to "tune" the contact angle of the inks of the present invention on selected polymer surfaces. Thus, for the same ejected droplet volume from an ink jet head, the lateral dimension can be controlled. It is possible to confine the lateral dimension of a printed line to 40 microns on both the top and bottom electrodes without the need for using complementary patterning techniques for the ink jet printing process. An example of an ink jet printed PEDOT:PSS line using ink formulation 1 as described above is shown in FIG. 5. The track was fabricated on a film of P(VDF/TrFE) using direct ink jet printing without the need for using additional patterning techniques and both the top and bottom electrodes have been confined to a width of 40 microns.

It is noted that in this case the bottom electrodes are printed on a substrate subsequently coated with P(VDF/TrFE). The electronically functional P(VDF/TrFE) film is then deposited on top of the printed electrodes.

In addition, the modified inks may also be used to print tracks on hydrophobic surfaces exhibited by other polymers such a poly(methyl methacrylate) (PMMA) and other non-polar polymers such as poly(isoprene), poly(isobutylate), poly(methyl pentene), polyamides & polyimides and poly(ethylene naphthalate). The modified inks may also be deposited on insulator materials to isolate the resulting electrodes and/or tracks from other circuit components.

Other aqueous inks may be modified in order to exhibit the same wetting behaviour on hydrophobic or hydrophobic-like surfaces in general. In the present application, the term solution includes colloidal suspensions based in water containing materials such as metals (silver, gold), carbon, aluminium oxide, silicon nitride and silicon dioxide dispersed in water, all of which may also be modified in order to allow printing on otherwise de-wetting surfaces. Surface tension-reducing agents other than Triton X-100 may also be used. For example, Triton X-114 and Triton X-405 are also considered as suitable surface tension-reducing agents for use in the present invention.

In addition, Triton X-45, which has the chemical formula

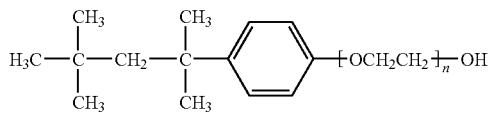

n~8 is considered a suitable surface-tension reducing agent.

In comparison, as shown in FIG. 3, Triton X-100 has the chemical formula

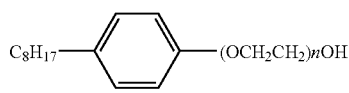

n~10

Notably, both these Triton X materials include a chain of ethylene and alkyl groups.

It is noted that in the preceding examples, the pure Triton X material was used and subsequently diluted. However, solutions in water are commercially available.

In the process of fabricating an electronically functional device, drying and/or annealing treatments are often employed. The function of such steps is to remove residual solvents from solution based materials after deposition, to chemically convert a material to another (less soluble) form, or to sinter a material (typically for ceramics or metals with a chemical coating on the material particles). Such a process can be employed in the case of an ink containing the Triton or another surfactant. To ensure complete removal, the deposited material should be dried at the boiling point of the Triton or other surfactant (Triton X-100-270° C.) at atmospheric pressure. Alternatively lower temperatures may be used at reduced pressures.

In Inks 1-4 described above, the concentration of the Baytron-P material is 33% by volume, which has been found to provide a suitable viscosity for inkjet printing, while providing sufficient PEDOT:PSS (0.165% PEDOT and 0.264% PSS) in the solution for effective conducting tracks after evaporation of the solvent. However, other concentrations providing suitable values of viscosity and conductivity are also encompassed by the scope of the present invention.

Although the present invention has been described primarily in relation to inkjet printing, it is to be understood that other forms of printing are also contemplated. For example, screen printing is considered suitable for use in the present invention. In common with inkjet printing, screen printing allows the formation of tracks on a hydrophobic or hydrophobic-like substrate without any need to perform patterning afterwards.

The foregoing description has been given by way of example only and a person skilled in the art will appreciate that modifications can be made without departing from the scope of the present invention.

What is claimed is:

1. A method of manufacturing a device, the method comprising:
    forming a first conductive line on a substrate;
    forming a ferroelectric layer on the first conductive line, the ferroelectric layer including an organic material; and
    forming a second conductive line on the ferroelectric layer by applying a liquid material using an inkjet method, the liquid material including a water-based solvent, an electronically functional substance, and a surface tension reducing agent, a contact angle between the liquid material and the ferroelectric layer not being less than 10 degrees.

2. The method of manufacturing the device according to claim 1, further comprising:
    preparing a dispersion liquid including PEDOT:PSS and a diluted aqueous solution before the forming of the liquid material; and
    forming the liquid material by mixing the dispersion liquid and the diluted aqueous solution before the forming of the second conductive layer.

3. The method of manufacturing the device according to claim 1, further comprising:
    preparing a dispersion liquid including PEDOT:PSS, a deionized water and a diluted aqueous solution before the forming of the liquid material; and
    forming the liquid material by mixing the dispersion liquid, the deionized water and the diluted aqueous solution before the forming of the second conductive layer.

4. The method of manufacturing the device according to claim 1, the organic material including a polymer material.

5. The method of manufacturing the device according to claim 1, the organic material including a P(VDF/TrFE).

6. The method of manufacturing the device according to claim 1, the surface tension reducing agent including a chain of ethylene and alkyl groups.

7. The method of manufacturing the device according to claim 1, the surface tension reducing agent including a polyethylene glycoltert-octylphenyl ether.

8. The method of manufacturing the device according to claim 1, the forming of the second conductive line including applying a plurality of first droplets of the liquid material in a line and applying a plurality of second droplets of the liquid material so that the plurality of second droplets fill a plurality of gaps between the plurality of first droplets.

9. The method of manufacturing the device according to claim 1, the ferroelectric layer having a hydrophobic surface.

10. The method of manufacturing the device according to claim 1, a contact angle between the liquid material and the ferroelectric layer being 30 degrees.

11. A method of manufacturing a device, the method comprising:
    forming a conductive line on an organic material by applying a liquid material using an inkjet method, the liquid material including a solvent, an electronically functional substance, and a surface tension reducing agent having a chain of ethylene and alkyl groups, a contact angle between the liquid material and the organic material not being less than 10 degrees.

12. The method of manufacturing the device according to claim 11, the forming of the conductive line including applying a plurality of first droplets of the liquid material in a line and applying a plurality of second droplets of the liquid material so that the plurality of second droplets fill a plurality of gaps between the plurality of first droplets.

* * * * *